ns 
Pedinoff

[11] 3,988,671
[45] Oct. 26, 1976

[54] METHOD AND APPARATUS FOR COLINEAR ACOUSTO-OPTIC RF SPECTRUM ANALYSIS

[75] Inventor: Melvin E. Pedinoff, Canoga Park, Calif.

[73] Assignee: Hughes Aircraft Company, Culver City, Calif.

[22] Filed: Mar. 17, 1975

[21] Appl. No.: 558,761

[52] U.S. Cl. .............................. 324/77 K; 350/150; 356/79; 250/216
[51] Int. Cl.² .......................................... G01R 23/16
[58] Field of Search........... 324/77 K; 350/150, 161, 350/162; 250/216; 356/79

[56] References Cited
UNITED STATES PATENTS

| 2,464,738 | 3/1949 | White et al. ...................... 350/162 R |
| 3,483,386 | 12/1969 | Jernigan.......................... 350/162 R |
| 3,485,552 | 12/1969 | Adler............................... 350/162 R |
| 3,573,449 | 4/1971 | Maloney ........................... 324/77 K |
| 3,674,332 | 7/1972 | Kogelnik.......................... 350/162 R |
| 3,740,117 | 6/1973 | Hubby, Jr. ......................... 350/150 |

Primary Examiner—Gerard R. Strecker
Assistant Examiner—Michael J. Tokar
Attorney, Agent, or Firm—Donald C. Keaveney; W. H. MacAllister

[57] ABSTRACT

There is disclosed a method and apparatus for radio frequency signal spectrum analysis wherein an acoustic wave having frequency components representative of those which exist in the radio frequency signal to be analyzed is derived from the signal and transmitted through an optically anisotropic crystal simultaneously and colinearly with a beam of polarized wide-band white light. The acoustic wave produces changes in the index of refraction of the crystalline material which result in diffraction of the plane of polarization of those frequency components of the light beam which bear a unique predetermined relationship to the frequency components present in the acoustic wave. The output of the crystal is then passed through a polarization analyzer to transmit only those frequency components which have been polarization diffracted. The light output of the polarization analyzer is applied to a grating or other means for dispersing the light output so that its various frequency components are deflected by varying amounts indicative of the frequency. The rays deflected from the grating or other dispersing means are then displayed in any suitable manner to provide a visually readable spectrum analysis of the original signal.

10 Claims, 3 Drawing Figures

METHOD AND APPARATUS FOR COLINEAR ACOUSTO-OPTIC RF SPECTRUM ANALYSIS

BACKGROUND OF THE INVENTION

In the past spectrum analyzers for determining the sinusoidal frequency components of complex radio frequency signals containing several such components vectorially added have consisted primarily of sweep tuned local oscillator-superheterodyne receivers which can only display signals sequentially. Other analyzers have been based on Bragg acousto-optic diffraction cells which have the disadvantage that they cannot be driven over large frequency ranges without introducing harmonic distortions because the acoustic transducer designs must provide for a steered acoustic beam to maintain the Bragg interaction angle over the radio frequency range. The Bragg devices can display several signals simultaneously but cannot maintain fidelity over large frequency ranges.

In the heretofore unrelated art of optical filters, an acoustic-optic tunable filter has recently been developed and reported by S. E. Harris and R. W. Wallace as described beginning at page 744 of Volume 59, Number 6 of the *Journal of the Optical Society of America* in June 1969. Further details were given by S. E. Harris and S. T. K. Nieh at pages 223–225 of Vol. 17 No. 5 of *Applied Physics Letters* 1 Sept. 1970 and by the same authors together with D. K. Winston at pages 325 and 326 of Vol. 15 No. 10 of *Applied Physics Letters* 15 Nov. 1969. This tunable filter employed a phenomenon originally described in detail by R. W. Dixon (IEEE J. Quantum Electron. Q. E. - 3, 85 (1967). Dixon noted that in an appropriately oriented crystal, an incident optical beam of one polarization is diffracted into the orthogonal polarization via its interaction with a colinearly propagating acoustic beam. In order for this phenomenon to occur, the active crystal medium must possess a non-zero element of the photoelastic tensor appropriate to the interaction. The appropriate photoelastic constant depends on such factors as crystal symmetry and whether a longitudinal or transverse acoustic wave is employed. Moreover, for the coupling to be effective along the whole interaction length, it is necessary that the optical and acoustic waves be appropriately phase matched. For a given acoustic frequency the phase matching condition is satisfied over a relatively narrow range of optical wavelength. Hence, only light in this wavelength range will be scattered to the orthogonal polarization.

Harris and Wallace proposed an electronically tunable optical filter using this phenomenom. Their basic idea was to utilize colinear acousto-optic diffraction in an optically anisotropic medium in such a fashion that by changing the frequency of a pure sinusoidal driving acoustic wave, changes were produced that the filter passed. In their paper they give the specific details for a filter using a crystal of LiNbO$_3$. The Harris and Nieh paper described a filter using a crystal of CaMoO$_4$. Both papers note that when an acoustic wave travels in such a crystal, the strain induced change of the refractive index of the medium may diffract a light beam that is incident on the medium. In an isotropic medium, the polarization of the diffracted light is unchanged and the diffraction is particularly strong when the light is incident at the Bragg angle. In an anisotropic medium, for certain orientations, light may be diffracted from one polarization to another. In this case, the condition for particularly strong interaction between the acoustic wave and the light wave is that the sum of the $\overline{k}$ vectors of the incident light and the acoustic wave equal the $\overline{k}$ vector of the orthogonally polarized diffracted wave. In their filter a crystal orientation is chosen such that an incident optical signal of one polarization is diffracted into the orthogonal polarization by a colinearly propagating acoustic beam. For a given acoustic frequency only a small range of optical frequencies will satisfy the $\overline{k}$ vector matching condition and only this small range of frequencies will be cumulatively diffracted into the orthogonal polarization. If the acoustic frequency is changed, the band of optical frequencies which the filter will pass is changed.

In the Harris device the crystal is preceeded by a polarizer through which the light to be filtered is passed before entering the crystal and is followed by an analyzer having its polarization axis orthogonal to that of the polarizer so that only those frequency components of the beam which have been diffracted orthogonally in the crystal will pass through the analyzer. An acoustic transducer supplies to the crystal a constant radio frequency signal of known preselected fixed single frequency to determine the pass band of the filter with respect to an optical light beam of unknown mixed and/or variable frequency components.

The general analytic theory of diffraction of light by ultrasonic waves has been discussed at pages 593 through 610 of a book published in 1970 by the Pergamon Press entitled "Principles of Optics" by M. Born and E. Wolf. The application of this analysis to this phenomenon is presented in the above-referenced papers. This analysis is herein assumed as a basis for the mode of operation of the present invention.

SUMMARY OF THE INVENTION

The present invention provides a method and apparatus whereby the filter described by Harris et al. can be used to perform the inverse function from that for which it was originally intended. Thus, by passing a wideband optical signal comprising a collimated beam of white light through the filter, one can determine the frequency components of an electronic signal generated ultrasonic wave of mixed unknown frequency components propagating through the filter colinearly and simultaneously with the optical signal. The output optical components are then dispersed to provide an image of the frequency spectrum.

It is an object of this invention to provide a method and apparatus for analyzing and displaying the frequency components in a radio frequency signal which method and apparatus utilize the above discussed phenomena of polarization diffraction of light by ultrasonic waves passing through a crystal simultaneously and colinearly with the diffracted light beam.

BRIEF DESCRIPTION OF THE DRAWINGS

These and other objects, advantages and features of the invention will be apparent from the detailed description below taken in conjunction with the accompanying drawings wherein like reference characters refer to like parts throughout and in which.

DETAILED DESCRIPTION OF THE INVENTION

Figure 1:
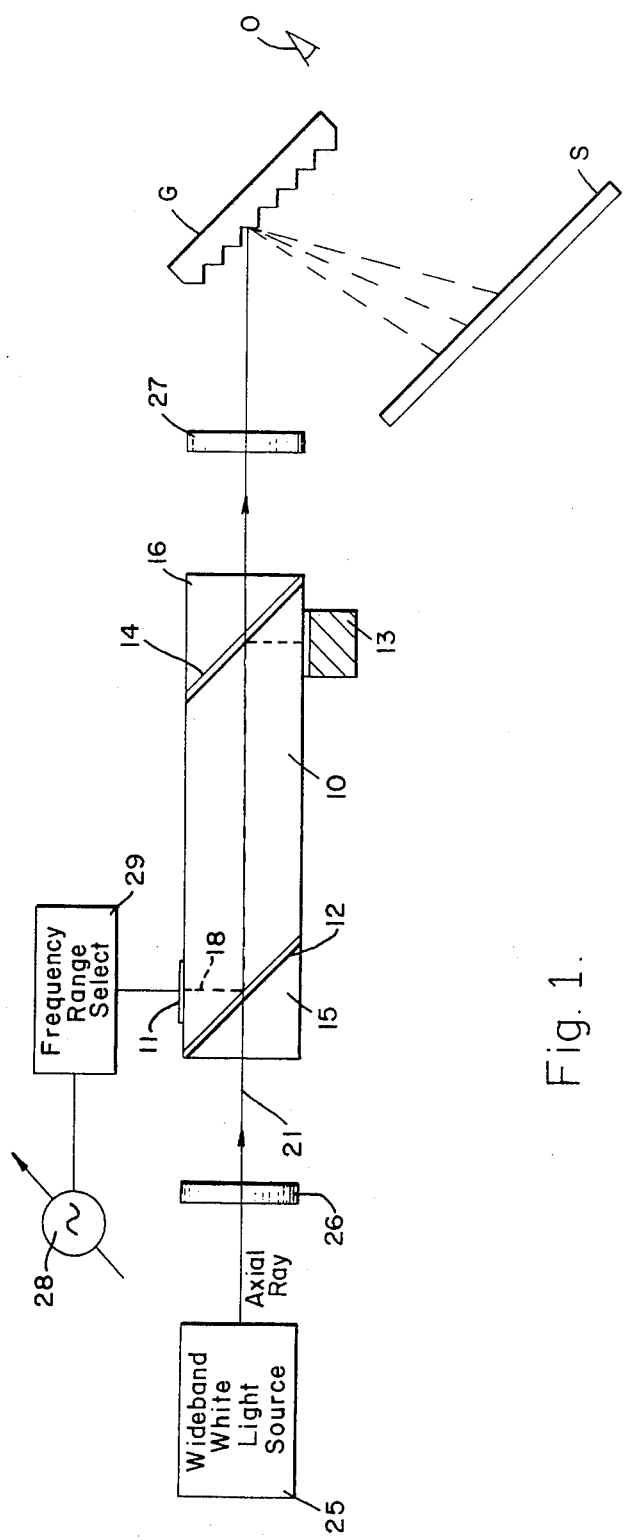
FIG. 1 is an optical schematic and block diagram of a spectrum analyzing apparatus suitable for carrying out the method of the present invention.
Figure 3:
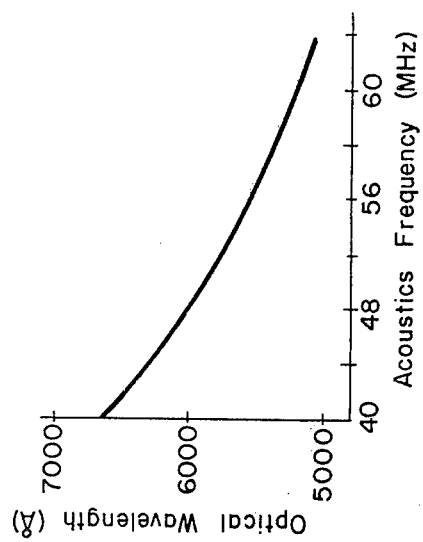
FIG. 3 is a graph showing the relationship between the optical frequency of the ordinary ray in the light beam which is scattered and the corresponding acoustic frequency which causes scattering of that ray.

Turning now to the drawing there is shown in FIG. 1 a crystal 10 which is preferably CaMoO$_4$ but also may be LiNbO$_3$, or LiIO$_3$, for example, and which functions as the acousto-optic element providing colinear interaction in the present invention. More generally, this crystal must be a birefringent material which has in its piezo-optic tensor p$_{ij}$, at least one non-vanishing term p$_{54}$, p$_{45}$, p$_{46}$, p$_{56}$, and for c-axis propagation in biaxial crystals p$_{65}$ or p$_{64}$. Of the crystals which satisfy this requirement those given above are the ones for which a measurement has been reported in the literature for one of the appropriate tensor elements and for an appropriate velocity. In the above-referenced article in "Applied Physics Letters" by Harris and Nieh, for example, it is reported that a crystal of CaMoO$_4$, is tunable from 6,700A to 5,100A by changing the acoustic frequency from 40 MHz to 68 MHz. A graph of this experimentally observed relationship which may be used to calibrate the device disclosed herein is shown in FIG. 3.

More generally, the relationship between f$_o$, the optical frequency of the ordinary ray which is polarization diffracted and f$_a$, the frequency of the acoustic wave is given by the expression $$f_o = \frac{c}{V} \frac{1}{|\Delta n|} f_a$$

where c is the optical velocity in vacuum, V is the acoustic velocity in the crystal medium and $\Delta n$ is the birefringence of the crystal. This relationship was reported in the article by Harris, Nieh and Winslow. For our present purposes it is more conveniently rewritten as $$f_a = \frac{V|\Delta n|}{\lambda_o}$$

where $\lambda_o$ is the optical wavelength of the diffracted ordinary ray.

Turning now to FIG. 1 it will be seen that the crystal 10, which is shown therein in cross section, is of generally rectangular configuration. As seen therein it is cut at 45° at each end to provide input and output faces for the acoustic wave. An acoustic transducer 11 is positioned on the top lateral surface of the crystal above the 45° end surface 12 so that an unobstructed optical path may be provided by driving the medium from this laterally located transducer. The optical sheer wave 18 is specularly reflected off the 45° surface 12 and terminates with similar geometry in the anechoic termination 13 provided beneath the 45° surface 14. A sapphire prism 15 may be provided to match the 45° surface at the input end and a prism 16 of crystalline CaMoO$_4$ material is provided at the output end. Since the internal incidence angle of 45° for the optical rays is beyond the critical angle for total internal reflection at a crystal-air interface, a film of carbon tetrachloride, or other suitable liquid, is interposed at the boundary between prism 15 and crystal 10 to serve as an index matching fluid. The use of the matching right angle prism 16 in close proximity to the 45° surface 14 allows the axial ray 21 to enter and exit the system without refractive deflection.

A source 25 of wideband white light transmits its output along an optical axis defined by axial ray 21 passing first through polarizer 26 and then entering through prism 15 into the crystal 10 from which it exits through prism 16 to polarization analyzer 27 the output of which is directed to a diffraction grating G from which it is reflected to a display screen S to be observed by the observer O. The point of observation is, of course, located out of the plane of the drawing and above the grating G. The light source 25 preferably has all of its frequency components of constant and equal amplitude.

The acoustic transducer 11 is driven by the radio frequency electrical signal derived from a source 28 of variable and mixed frequency components whose spectrum is to be analyzed. This signal is applied to the transducer 11 through a frequency range selector circuit 29. It will be noted from the calibrating curve shown in FIG. 3 that radio frequency signals ranging from 40 to 68 MHz will produce polarization diffraction of optical wavelengths ranging respectively from approximately 6,700A to 5,100A as given precisely by the above stated relationship. Hence, if the frequency range selector circuit 29 is set by a multipole selector switch of the type commonly used in ohmmeters and multimeters to be simply a closed transmission path for the signal from RF source 28, the spectrum analyzer will function to provide an optical display of frequency components in the input signal which lie within the range of 40 through 68 MHz. If it is desired to analyze signals for higher or lower frequency components, appropriate heterodyne frequency translating networks in frequency range selector circuit 29 are switch selectably connected in circuit between signal source 28 and transducer 11. Each such network includes a local oscillator of fixed frequency and an appropriate output filter to derive a sum or difference frequency so that the network will shift all frequency components of the original signal up or down by a known fixed amount determined by the oscillator and filter in order to bring the transducer signal within the calibration range of the crystal to thereby provide a new frequency spectrum analyzing range for the system. If it is desired to analyze frequency components of different frequency than the initial range without relying solely on frequency translation, then additionally, and/or alternatively, a second or third crystal of different material having different frequency response characteristics may be switch selectably used in the system. For example, as noted above, CaMoO$_4$ is tunable from 6,700A to 5,100A by acoustic signals ranging from 40 MHz to 68 MHz. On the other hand, a crystal of LiNbo$_3$ is tunable from 4,000A to 7,000A by acoustic signals ranging from 428 MHz to 990 MHz. A single system may include one crystal of each type, each having its own transducer through which each is switch selectably connected to the output of range selector 29. Each such crystal, of course is also provided with its own analyzer, grating and screen to thereby form a multichannel system in which each channel may have a plurality of selectable frequency ranges.

It is thus seen that in operation by passing a wide band white light optical signal through one such channel comprising the polarizer, crystal, analyzer, diffraction grating, and display screen one can determine the frequencies in an ultrasonic wave propagating through the filter colinearly with the optical signal. The transmitted optical signal frequencies $f_o$ are related to the ultrasonic frequencies $f_a$ in the filter in a unique manner for each cyrstal by the relationship set forth above. The ultrasonic frequencies in the crystal are in turn related to and representative of the frequencies in the spectrum of the signal from source 28 to be analyzed in a known manner determined by the switch setting of frequency range selector network 29. Thus, by passing the filtered light through a prism or grating to disperse the light one can get a visual presentation of optical frequencies representative of the radio frequencies driving the ultrasonic transducer to produce the ultrasonic wave which is in the crystal. The screen S on which the optical image is displayed may be provided with scales to read frequency values directly for each setting of the frequency range selector.

Figure 2:
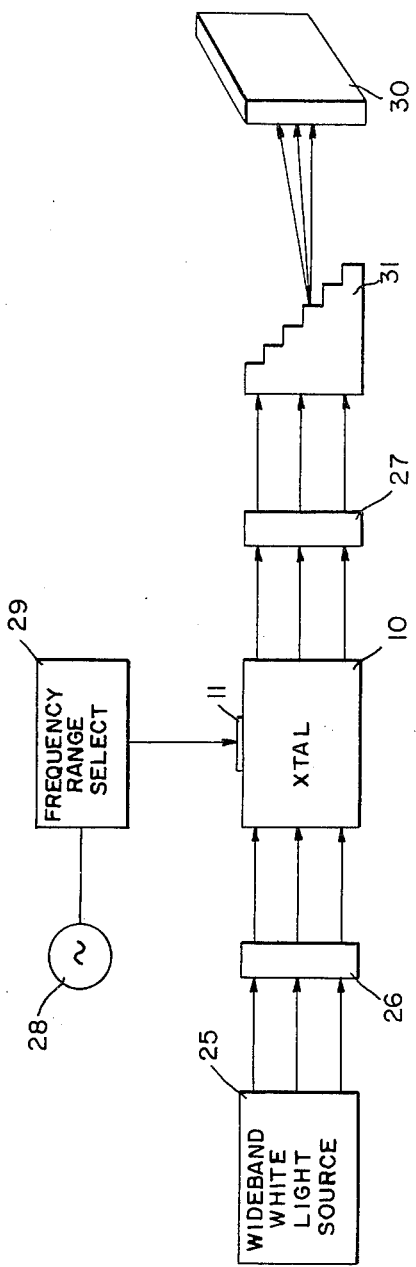
FIG. 2 is a block diagram of a modification of the system of FIG. 1 in which the final image is displayed by means of an image converter.

The device of the invention produces a real time optical display in which the position (and/or) color of the light beam is proportional to the frequency of the electrical signal impressed on the system and the intensity of the optical beam is proportional to the intensity of the electrical signal. The device simultaneously displays a large number of electrical frequencies independently and without regard to repetition rate or duty cycle. The integrated visual intensity is proportional to the average radio frequency power in the given signal. The device can be used to project an image onto a screen larger than the face of a cathode ray tube thus yielding high visual resolution if required. Also, as shown in FIG. 2 the device can be used in conjunction with an image intensifier tube 30 for displaying weak signals. If one desires to achieve straight through transmission of the filtered beam, an echellette grating 31 may be used in place of the diffraction grating G shown in FIG. 1.

As noted above, it has in the past been necessary in analyzing a given spectrum to use either sweep tuned local oscillator superheterodyne receivers which only display signals sequentially or Bragg acousto-optic diffraction devices which in the acoustic transducer design must provide for a steered acoustic beam to maintain the Bragg interaction over the RF frequency range and which may result in harmonic distortion of the displayed spectrum.

A particular advantage of the present invention is the use of a non-angularly scanned acoustic beam. This permits simple wideband transducers to be used. The resolution of the present system is given by the relationship $$R = \frac{f}{\Delta f} = \frac{\lambda}{\Delta \lambda}.$$

For the case of $LiNbO_3$, resolution has been found to be $2.5 \times 10^3$ which is equal to 2 A at a 5,000A wavelength. This means that at 30 MHz radio frequency, for example, one can obtain a resolution of 12 KHz. This can be improved by a factor of 5 to 10 by using a more highly collimated white light source.

The corresponding resolution values for $CaMoO_4$ are as follows: $R = 5900/8 = 737.5 = f/\Delta f$. At a center frequency of 54 MHz the resolution is thus approximately $7.34 \times 10^4$ cycles or 73 KHz.

The function of the grating G shown in FIG. 1 and the echellette grating 31 shown in FIG. 2 is to deflect the light through a different angle for each wavelength. The resolution of a grating is given by $$\frac{\lambda}{d\lambda} = NM$$

where M is the grating order and N is the number of lines illuminated by the light beam. Typical grating resolution in the visible is about $10^3$ to $10^4$ using low order numbers and small optical beam size of about 0.5 centimeters in diameter. This is easily increased by one or two orders of magnitude if required. Thus the resolution of the crystal analyzer device is not compromised by the grating.

It is thus seen that there has been provided a method and apparatus for analysis of the frequency of a radio frequency signal which can be driven over larger frequency ranges than prior art acoustic type analyzers because the requirement for use of a steered acoustic beam to maintain a particular interaction angle is not herein imposed and yet which can still display several signals simultaneously over the increased frequency range and still provide improved fidelity and resolution.

What is claimed is:
1. The method of analyzing the frequency spectrum of a radio frequency signal comprising the steps of:
    a. deriving from said radio frequency signal an acoustic wave having frequency components respresentative of the frequency components of said radio frequency signal;
    b. simultaneously transmitting said acoustic wave and a beam of polarized wideband white light colinearly through an optically anisotropic crystal to produce acousto-optic diffraction of the plane of polarization of those frequency components of said light beam which bear a predetermined relationship to the frequency components present in said acoustic wave;
    c. passing said polarization diffracted light beam through a polarization analyzer to transmit only those frequency components which have been polarization diffracted;
    d. dispersing the light output of said polarization analyzer by deflecting each of the frequency components thereof by an amount which is proportional to the frequency of said component; and
    e. displaying an image of said dispersed components to provide an analysis of the spectrum of said radio frequency signal.
2. A method as in claim 1 wherein said light is dispersed by reflecting it from a diffraction grating and wherein said image is directly displayed on a screen.
3. A method as in claim 1 wherein said light is dispersed by transmitting it through an echellette grating.
4. A method as in claim 1 wherein said image is displayed by applying said dispersed light to an image intensifier.
5. A radio frequency spectrum analyzer comprising:
    a. optically anisotropic crystal means for producing acousto-optic polarization diffraction of a light beam by an acoustic wave passing through said crystal means simultaneously and colinearly with said light beam;

b. transducer means for deriving said acoustic wave from a radio frequency signal to be analyzed and for applying said acoustic wave to said crystal means, said acoustic wave having frequency components representative of those of said radio frequency signal;

c. polarizer means having a predetermined axis of polarization;

d. wideband white light source means for supplying a beam of light having components of substantially constant and equal amplitudes at all frequencies thereof through said polarizer as an input to said crystal means;

e. a polarization analyzer having its polarization axis orthognal to said axis of said polarizer and positioned to receive the light output beam from said crystal means;

f. image display means; and g. light dispersing means positioned to receiver said light output beam from said polarization analyzer and to deflect said beam to said image display means, the amount of the deflection of each frequency component of said beam being proportional to the frequency of said component.

6. A spectrum analyzer as in claim 5 wherein said light dispersing means is a reflection diffraction grating.

7. A spectrum analyzer as in claim 5 wherein said light dispersing means is an echellette grating through which said light is transmitted.

8. A spectrum analyzer as in claim 5 wherein said image display means is a screen.

9. A spectrum analyzer as in claim 5 wherein said image display means is an image intensifier.

10. A spectrum analyzer as in claim 5 and further including means for selecting a frequency range to which the frequency components of the signal to be analyzed are translated before being applied to said transducer means to bring them within the calibration range of said crystal.

* * * * *